(12) United States Patent
Liu et al.

(10) Patent No.: US 12,414,374 B2
(45) Date of Patent: Sep. 9, 2025

(54) SUBSTRATE AND METHOD FOR MANUFACTURING THE SAME, AND DISPLAY PANEL

(71) Applicant: BOE Technology Group Co., Ltd., Beijing (CN)

(72) Inventors: Yingwei Liu, Beijing (CN); Zhanfeng Cao, Beijing (CN); Ke Wang, Beijing (CN); Guocai Zhang, Beijing (CN); Junwei Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 17/550,244

(22) Filed: Dec. 14, 2021

(65) Prior Publication Data

US 2022/0302177 A1 Sep. 22, 2022

(30) Foreign Application Priority Data

Mar. 19, 2021 (CN) .......................... 202110298339.4

(51) Int. Cl.
*H10D 86/60* (2025.01)
*H01L 25/075* (2006.01)
(Continued)

(52) U.S. Cl.
CPC ......... *H10D 86/60* (2025.01); *H01L 25/0753* (2013.01); *H10D 86/0231* (2025.01);
(Continued)

(58) Field of Classification Search
None
See application file for complete search history.

(56) References Cited

U.S. PATENT DOCUMENTS

2003/0089928 A1  5/2003  Saito et al.

FOREIGN PATENT DOCUMENTS

CN    107123505 A    9/2017
CN    110416248 A    11/2019
(Continued)

OTHER PUBLICATIONS

Liang et al., CN 111883551A, Substrate, Manufacturing Method Thereof, Display Panel and Display Device, Nov. 3, 2020 (Year: 2020).*

(Continued)

*Primary Examiner* — Alexander G Ghyka
(74) *Attorney, Agent, or Firm* — IPro, PLLC

(57) ABSTRACT

A substrate includes: a base substrate; an organic layer on the base substrate with openings defined through the organic layer; a first metal layer including first metal patterns, where the first metal pattern is in the opening, and includes a first portion parallel to a bottom of the opening and a second portion parallel to a lateral wall of the opening; a second metal layer having a thickness greater than a thickness of the first metal layer; where the second metal layer includes second metal patterns, the second metal pattern is located in the opening and is in contact with the first metal layer; and, a distance from a surface of the first metal layer away from the base substrate to a plane where the base substrate is located is smaller than a distance from a surface of the organic layer away from the base substrate to the plane.

17 Claims, 7 Drawing Sheets

(51) Int. Cl.
*H10D 86/01* (2025.01)
*H10D 86/40* (2025.01)
*H10H 20/857* (2025.01)

(52) U.S. Cl.
CPC ....... *H10D 86/0241* (2025.01); *H10D 86/443* (2025.01); *H10D 86/451* (2025.01); *H10H 20/857* (2025.01)

(56) References Cited

FOREIGN PATENT DOCUMENTS

| CN | 111883551 A | 11/2020 |
| WO | 2020108017 A1 | 6/2020 |

OTHER PUBLICATIONS

Shuichi, JP 2008219049A, Semiconductor Device, Production Process of Semiconductor Device, Circuit Board, Electro-optical Device, Electronic Equipment, Sep. 18, 2008Semiconductor Device (Year: 2008).*

CN 109698160, Wei et al., Array Basal Plate and its Manufacturing Method, Display Panel, Display Device, Apr. 30, 2019 (Year: 2019).*

CN 202110298339.4 first office action dated Feb. 7, 2025.
CN 202110298339.4 second office action dated Jul. 12, 2025.

* cited by examiner

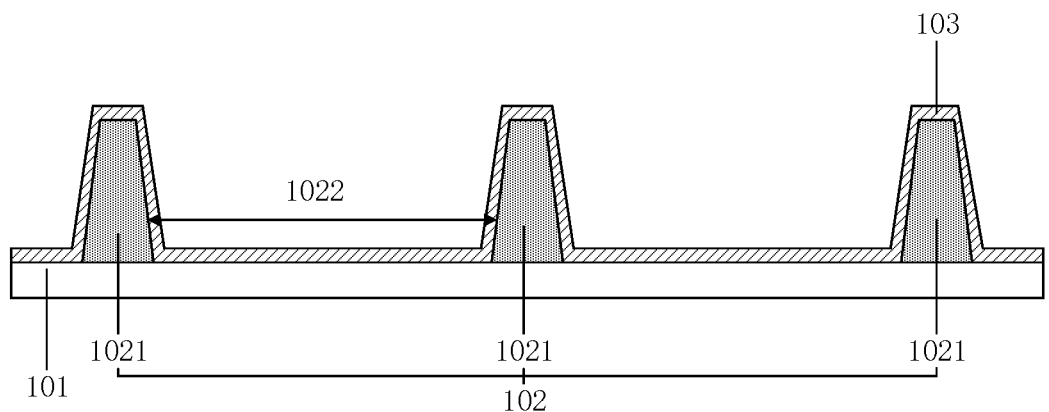

FIG. 10

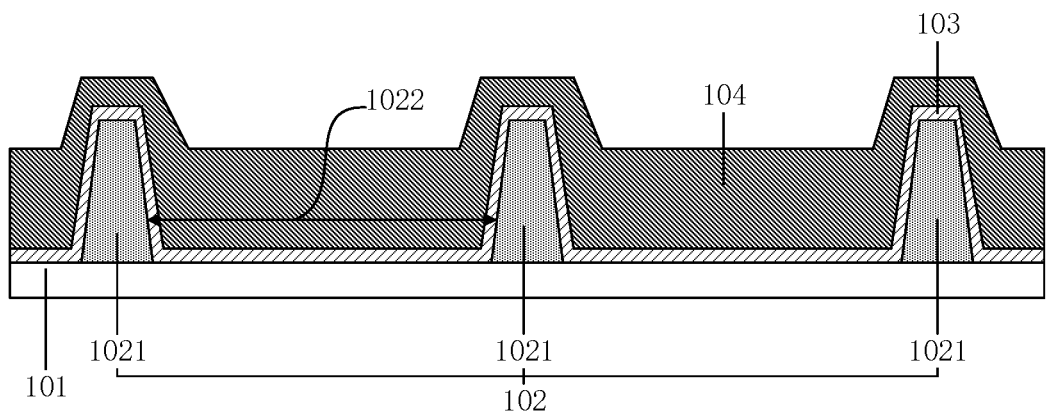

FIG. 11

```
forming a photoresist layer on one side of the second metal layer away from the
base substrate, and exposing and developing the photoresist layer to remove the      —— S401
              photoresist layer in an area outside the opening removing the second metal layer and the first metal layer in the area outside the    —— S402
                          opening with wet etching peeling off the remaining photoresist to obtain the first metal pattern and the      —— S403
                           second metal pattern
```

FIG. 12

SUBSTRATE AND METHOD FOR MANUFACTURING THE SAME, AND DISPLAY PANEL

CROSS-REFERENCE TO RELATED APPLICATIONS

The present application claims a priority to the Chinese patent application No. 202110298339.4 filed in China on Mar. 19, 2021, a disclosure of which is incorporated herein by reference in its entirety.

TECHNICAL FIELD

The present application relates to the field of LED and LCD display technologies, and in particular to a substrate, a method for manufacturing the same, and a display panel.

BACKGROUND

Light-emitting diodes (LEDs) have two main applications in display devices: one is used as a self-luminous LED display device, and the other is used as a backlight for a liquid crystal display (LCD) device.

With continuous development of display requirements, millimeter-level LEDs (mini LEDs) and micron-level LEDs (micro LEDs) are applied to display devices. For the mini LED/micro LED, thick copper with high current-carrying capacity is required, as a driving current of the LED is tens of milliamperes. For example, a copper film with a thickness of about 7 µm is required in some applications. However, it is difficult to fabricate a copper film of such thickness by sputtering deposition method.

The electroplating method can fabricate a thick copper film, but the subsequent etching will take a long time, resulting in larger etching bias, which cannot meet mass production requirements. If a semi-additive process is used to form patterns of a thick copper layer, there will be a problem of uneven thickness due to uneven electric field density in an electroplating area.

SUMMARY

In a first aspect, one embodiment of the present disclosure provides a substrate, including: a base substrate; an organic layer on one side of the base substrate with a plurality of openings defined through the organic layer; a first metal layer including a plurality of first metal patterns, wherein the first metal pattern is located in the opening, and includes a first portion parallel to a bottom of the opening and a second portion parallel to a lateral wall of the opening; a second metal layer having a thickness greater than a thickness of the first metal layer; wherein the second metal layer includes a plurality of second metal patterns, the second metal pattern is located in the opening and is in contact with the first metal layer; and, a distance from a surface of the first metal layer away from the base substrate to a plane where the base substrate is located is smaller than a distance from a surface of the organic layer away from the base substrate to the plane where the base substrate is located.

Optionally, the substrate further includes: an adhesion enhancement layer between the organic layer and the first metal layer; wherein the adhesion enhancement layer covers the surface of the organic layer and the bottom of the opening.

Optionally, the second metal pattern includes a first region having a first thickness, and a second region around the first region and having a second thickness; and the second thickness is not less than 90% of the first thickness.

Optionally, the substrate further includes: a first insulating layer on one side of the second metal layer away from the base substrate; a first planarization layer on one side of the first insulating layer away from the base substrate; a third metal layer on one side of the first planarization layer away from the base substrate, wherein the third metal layer includes a plurality of third metal patterns, each of the third metal patterns is electrically coupled to one of the second metal patterns; a second insulating layer on one side of the third metal layer away from the base substrate; and a second planarization layer on one side of the second insulating layer away from the base substrate.

Optionally, the second metal pattern includes a first signal line and a second signal line; the third metal pattern includes a first electrode and a second electrode; the first electrode is electrically coupled to one first signal line; and the second electrode is electrically coupled to one second signal line.

Optionally, the substrate further includes: a buffer layer between the base substrate and the organic layer; an active layer between the buffer layer and the organic layer, wherein the active layer includes a plurality of active islands; a third insulating layer between the active layer and the organic layer; a fourth metal layer between the third insulating layer and the organic layer, wherein the fourth metal layer includes a plurality of gates; a fourth insulating layer between the fourth metal layer and the organic layer; a fifth metal layer between the fourth insulating layer and the organic layer, wherein the fifth metal layer includes a source electrode, a drain electrode and a power supply line; a fifth insulating layer between the fifth metal layer and the organic layer; wherein the second metal pattern includes a first sub-pattern electrically coupled to the power supply line and a second sub-pattern electrically coupled to the drain electrode; the third metal pattern includes a first electrode and a second electrode, the first electrode is electrically coupled to one first sub-pattern, and the second electrode is electrically coupled to one second sub-pattern.

Optionally, the organic layer is made of photosensitive resin; and a thickness of the organic layer is in a range of 5 µm to 8 µm; the second metal layer is made of material including copper, and a thickness of the second metal layer is in a range of 3 µm to 7 µm.

Optionally, the first metal layer and the second metal layer are stacked on the base substrate.

In a second aspect, one embodiment of the present disclosure provides a display panel including the foregoing substrate and a light-emitting diode electrically coupled to the substrate.

In a third aspect, one embodiment of the present disclosure provides a method for manufacturing a substrate, including: forming an organic layer on one side of a base substrate, and patterning the organic layer to form a plurality of openings defined through the organic layer; forming a first metal layer on one side of the organic layer away from the base substrate; forming a second metal layer on one side of the first metal layer away from the base substrate by electroplating, wherein a thickness of the second metal layer is greater than a thickness of the first metal layer; patterning the first metal layer and the second metal layer, so that the second metal layer includes a plurality of second metal patterns and the first metal layer includes a plurality of first metal patterns; wherein the first metal pattern is located in the opening, and includes a first portion parallel to a bottom of the opening and a second portion parallel to a lateral wall of the opening; the second metal pattern is located in the opening and is in contact with the first metal pattern; a distance from a surface of the second metal layer away from the base substrate to a plane where the base substrate is located is smaller than a distance from a surface of the organic layer away from the base substrate to the plane where the base substrate is located.

Optionally, the method further includes: before forming the first metal layer, forming an adhesion enhancement layer on one side of the organic layer away from the base substrate, wherein the adhesion enhancement layer covers the bottom of the opening and the surface of the organic layer.

Optionally, the patterning the first metal layer and the second metal layer, includes: forming a photoresist layer on one side of the second metal layer away from the base substrate, and exposing and developing the photoresist layer to remove the photoresist layer in an area outside the opening; removing the second metal layer and the first metal layer in the area outside the opening with wet etching; and peeling off remaining photoresist to obtain the first metal pattern and the second metal pattern.

Optionally, the method further includes: sequentially forming a first insulating layer and a first planarization layer on one side of the second metal layer away from the base substrate, and patterning the first insulating layer and the first planarization layer, thereby forming a plurality of first via-holes defined through the first insulating layer and the first planarization layer; forming a third metal layer on one side of the first insulating layer away from the base substrate, and patterning the third metal layer to form third metal patterns; wherein at least part of the third metal patterns are electrically coupled to the corresponding second metal patterns; sequentially forming a second insulating layer and a second planarization layer on one side of the third metal layer away from the first insulating layer, and patterning the second insulating layer and the second planarization layer to form a plurality of second via-holes defined through the second insulating layer and the second planarization layer.

Additional aspects and advantages of the present application will be given in the following description, which will become apparent from the following description, or be understood through practice of the present application.

BRIEF DESCRIPTION OF THE DRAWINGS

The foregoing and/or additional aspects and advantages of the present application will become apparent and easy to understand from the following description of the embodiments in conjunction with the accompanying drawings, in which:

FIG. 10 is a process flowchart of a step S2 of the method shown in FIG. 8;

FIG. 11 is a process flowchart of a step S3 of the method shown in FIG. 8;

FIG. 12 is a flowchart of a step S4 of the method shown in FIG. 8;

REFERENCE SIGNS

Figure 1:
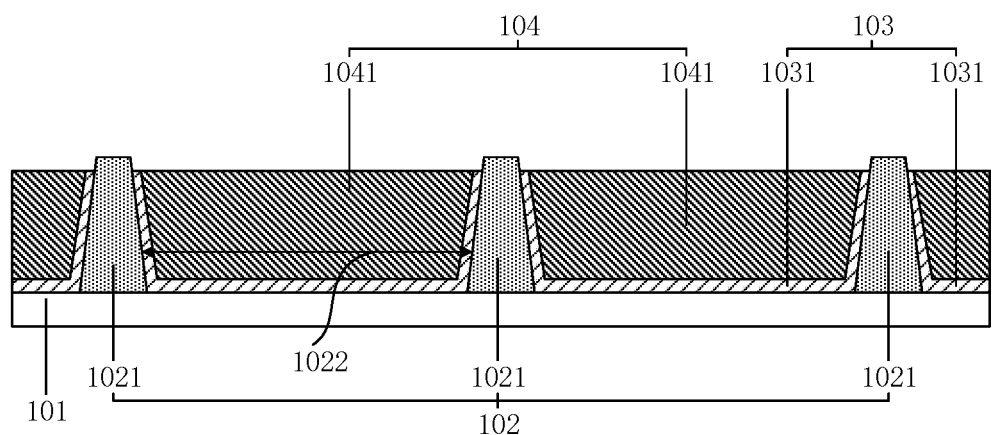
FIG. 1 is a schematic cross-sectional view of a substrate according to an embodiment of the present application.

101—base substrate; 102—organic layer; 1021—retaining wall; 1022—opening; 103—first metal layer; 1031—first metal pattern; 104—second metal layer; 1041—second metal pattern; 105—adhesion enhancement layer; 106—first insulating layer; 107—first planarization layer; 108—third metal layer; 1081—third metal pattern; 109—second insulating layer; 110—second planarization layer; 111—buffer layer; 112—active island; 1121—channel region; 1122—source region; 1123—drain region; 113—third insulating layer; 114—fourth metal layer; G-gate; 115—fourth insulating layer; 116—fifth metal layer; 1161—power supply line; S-source electrode; D-drain electrode; 117—fifth insulating layer; 2—light-emitting diode; 201—first pin; 202—second pin.

DETAILED DESCRIPTION

Reference will now be made in detail to the exemplary embodiments of the present application, examples of which are illustrated in the accompanying drawings, wherein the various details of the embodiments of the present application are included to facilitate understanding and are to be considered as exemplary only. Accordingly, a person skilled in the art should appreciate that various changes and modifications can be made to the embodiments described herein without departing from the scope and spirit of the present application. Also, descriptions of well-known functions and structures are omitted from the following description for clarity and conciseness.

The terms such as "first" and "second" in the specification and claims of the present application are merely used to differentiate similar components rather than to represent any order or sequence. It is to be understood that the data so used may be interchanged where appropriate, such that the embodiments of the present application described herein may be implemented in a sequence other than those illustrated or described herein. In addition, the terms "include" and "have" or their variations are intended to encompass a non-exclusive inclusion, such that a process, method, system, product, or device that include a series of steps or units include not only those steps or units that are explicitly listed but also other steps or units that are not explicitly listed, or steps or units that are inherent to such process, method, product, or device. In the specification and claims, "and/or" means at least one of the connected objects.

For array substrates or direct-type backlights used for large-size self-luminous LED display devices, due to their large sizes, a voltage drop of a current on a copper trace is very serious, and then a thicker copper metal trace is used. The higher the brightness requirement, the greater the thickness of the copper metal trace. Taking a direct-type backlight with a backlight brightness requirement higher than 2000 nit as an example, a thickness of a single-layer copper trace in a backlight driving substrate needs to be at least greater than 5 μm. According to current experience, for a copper trace with a thickness greater than 1.5 μm, the electroplating method is simpler and lower in cost than the magnetron sputtering method.

The inventors of the present application has conducted research and found that the electroplating method can fabricate a thick copper film, but the subsequent etching will take a long time, resulting in larger etching bias, which cannot meet mass production requirements. Therefore, it is better to use a semi-additive process to form a pattern of a thick copper layer.

The semi-additive process is to use an organic layer to form an opening for defining a pattern for a thick copper layer, then use the electroplating method to form the thick copper layer, and then etch the thick copper layer to obtain the pattern of the thick copper layer. Due to insulation properties of the organic layer, electric field lines in an area where the organic layer exists are concentrated toward the opening, resulting in uneven electric field distribution, which causes uneven thickness of the thick copper layer. In one specific embodiment, in a 32-inch substrate, a thickness of a thick copper layer made by electroplating in a fan-out area and a bonding leader area is 2 μm~3 μm greater than a thickness of the thick copper layer in a display area, which affects overall conductivity of the substrate. Further, in order to remove a seed layer that needs to be etched in the fan-out area and the bonding leader area, a part of the thick copper layer in the display area will be affected by the etching and then a surface roughness of the part of the thick copper layer in the display area is increased, which will affect bonding strength of the thick copper layer and a film layer on the thick copper layer in a subsequent process, resulting in problems such as bubbling, peeling, and even short-circuit. It should be noted that the "thick copper layer" involved here refers to a copper film layer with a thickness greater than 1 μm and usually produced by an electroplating process.

A substrate, a method for manufacturing the same and a display panel provided in the present application are intended to solve the above technical problems in the related art.

The technical solutions of the present application and how the technical solutions of the present application solve the above technical problems will be described in details hereinafter with specific embodiments.

Figure 2:
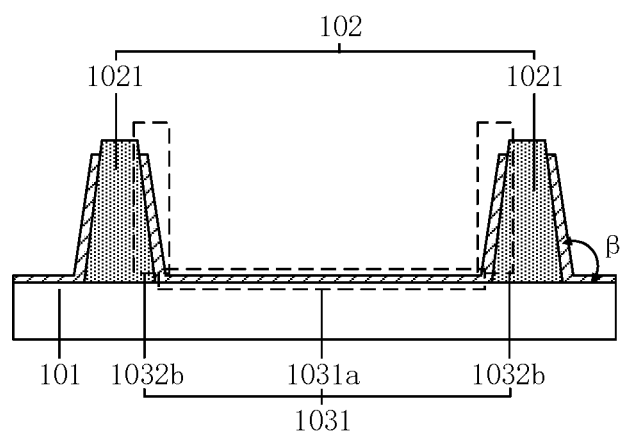
FIG. 2 is a schematic enlarged view of an opening in a substrate according to an embodiment of the present application.

One embodiment of the present application provides a substrate. As shown in FIG. 1 and FIG. 2, the substrate 1 provided in this embodiment includes a base substrate 101, an organic layer 102, a first metal layer 103 and a second metal layer 104. The base substrate 101 may be a rigid base substrate 101, such as a glass substrate 101.

As shown in FIG. 1, the organic layer 102 is located on one side of the base substrate 101, and a plurality of openings 1022 is defined through the organic layer 102. Specifically, as shown in FIG. 2, after the openings 1022 are defined in the organic layer 102, the patterned organic layer 102 includes a retaining wall 1021 surrounding the opening 1022, and a lateral wall of the retaining wall 1021 is a lateral wall enclosing the opening 1022. In one specific embodiment, a slope angle of the retaining wall 1021 is usually controlled at 70°-80° to ensure better continuity of subsequent metal layers.

Specifically, as shown in FIG. 1, the organic layer 102 is made of photosensitive resin, for example, the organic layer 102 is made of photoresist. In one specific implementation, a thickness of the organic layer 102 is adjusted according to a thickness of the second metal layer 104 to be prepared. Generally, the thickness of the organic layer 102 is controlled in a range of 5 μm to 8 μm.

As shown in FIG. 1 and FIG. 2, the first metal layer 103 includes a plurality of first metal patterns 1031. The first metal pattern 1031 is located in the opening 1022, and includes a first portion 1031a parallel to a bottom of the opening 1022 and a second portion 1032b parallel to the lateral wall of the opening 1022.

Specifically, the first metal layer 103 serves as a seed layer to facilitate subsequent formation of the second metal layer 104 on the first metal layer 103 by electroplating, and a thickness of the first metal layer 103 is 300 Å to 3000 Å. The first metal layer 103 may be a metal copper layer fabricated by magnetron sputtering. According to actual needs, the first metal layer 103 may also be made of an alloy material, such as molybdenum nickel titanium (MoNiTi) alloy. The first metal layer 103 may also be a composite film layer. For example, the first metal layer 103 includes a first layer of molybdenum nickel titanium (MoNiTi) alloy, and a second layer of metal copper material in a direction away from the base substrate 101 on the first layer.

As shown in FIG. 1, a thickness of the second metal layer 104 is greater than the thickness of the first metal layer 103. The second metal layer 104 includes a plurality of second metal patterns 1041. The second metal pattern 1041 is located in the opening 1022 and is in contact with the first metal layer 103. A distance from a surface of the first metal layer 103 away from the base substrate 101 to a plane where the base substrate 101 is located is smaller than a distance from a surface of the organic layer 102 away from the base substrate 101 to the plane where the base substrate 101 is located.

Specifically, the second metal pattern 1041 may be a metal wire, a metal electrode, or a combination thereof. The second metal layer 104 may be a metal copper layer fabricated by an electroplating method. The thickness of the second metal layer 104 is 3 μm to 7 μm. It should be noted that the first metal pattern 1031 and the second metal pattern 1041 in contact with the first metal pattern 1031 together form one metal structure, and the metal structure may be used as a wire, an electrode, a lap structure, a transition structure, etc. For ease of description, in subsequent embodiments, when a certain first metal pattern 1031 and a corresponding second metal pattern 1041 together form one metal structure and the metal structure is electrically coupled to a certain metal pattern of another film layer, it is only expressed as "the second metal pattern 1041 is electrically coupled to a certain metal pattern of another film layer".

In the substrate provided in the embodiment of the present application, by first forming the first metal layer 103 on the organic layer 102, the conductivity of the first metal layer 103 can make distribution of electric field densities more uniform, so that the thickness of the second metal layer 104 in the prepared substrate is more uniform, thereby ensuring the conductivity of the substrate. Meanwhile, the uniform thickness of the second metal layer 104 can avoid problems of increased roughness of the second metal layer 104 caused by the etching process.

Figure 3:
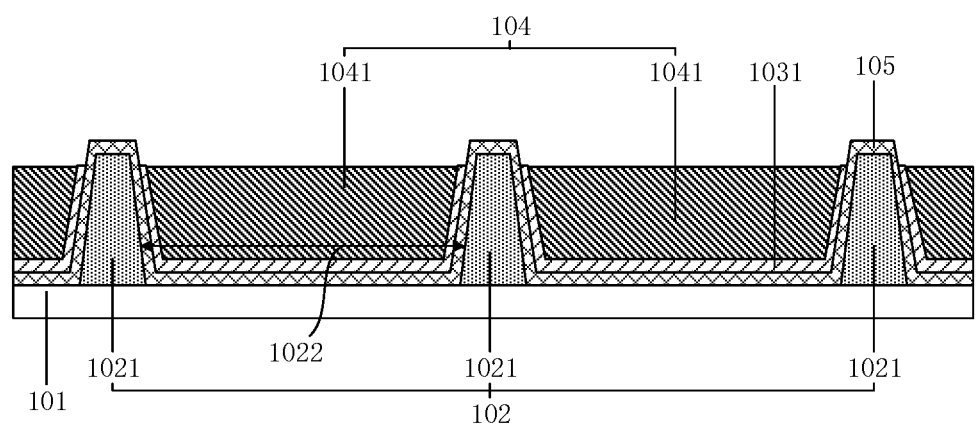
FIG. 3 is a schematic cross-sectional view of another substrate according to an embodiment of the present application.

Optionally, as shown in FIG. 3, the substrate provided in this embodiment further includes an adhesion enhancement layer 105. The adhesion enhancement layer 105 is located between the organic layer 102 and the first metal layer 103, and covers the surface of the organic layer 102 and the bottom of the opening 1022.

Specifically, the adhesion enhancement layer 105 is made of SiNx. A thickness of the adhesion enhancement layer 105 is 2000 Å to 6000 Å.

In this embodiment, the adhesion enhancement layer 105 can increase adhesion between the organic layer 102 and the first metal layer 103, thereby improving performance of the substrate. Further, the adhesion enhancement layer 105 can prevent the metal layer from directly contacting the organic layer 102, thereby preventing oxidation of the metal layer caused by the direct contact between the organic layer 102 and the metal layer in the subsequent manufacturing process, and then increasing service life of products.

Figure 4:
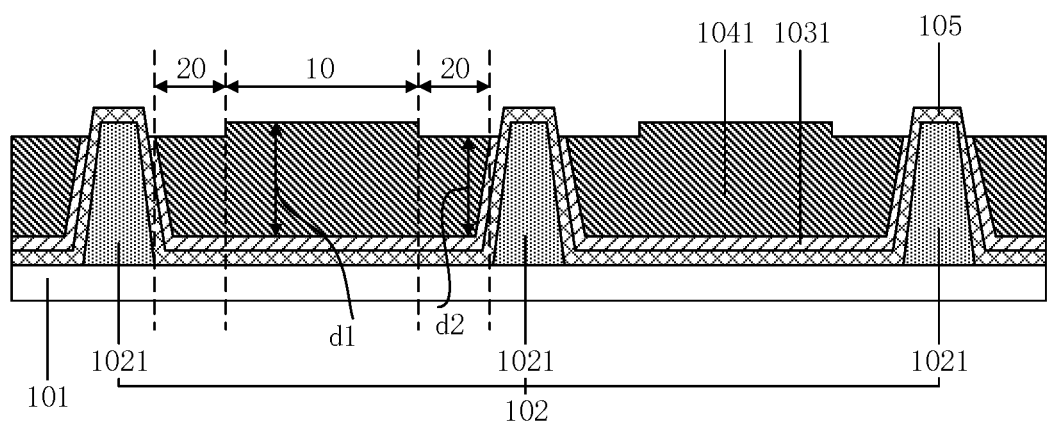
FIG. 4 is a schematic cross-sectional view of still another substrate according to an embodiment of the present application.

Optionally, as shown in FIG. 4, in the substrate provided in this embodiment, the second metal pattern 1041 includes a first region 10 having a first thickness d1, and a second region 20 around the first region 10 and having a second thickness d2. The second thickness d2 is not less than 90% of the first thickness d1.

Specifically, under ideal preparation conditions, the first region 10 and the second region 20 of the second metal pattern 1041 have the same thickness, that is, the first thickness d1 is equal to the second thickness d2; but in actual production, over-etching often occurs, but degrees of over-etching needs to be controlled to prevent excessive loss of the second metal pattern 1041 which will affect the conductivity and smoothness of the second metal pattern 1041.

In the substrate provided in this embodiment, a thickness difference between the first region 10 and the second region 20 of the second metal pattern 1041 is controlled within a reasonable range, which can ensure a cross-sectional area of the second metal pattern 1041, thereby ensuring conductivity requirements of the second metal pattern 1041.

Figure 5:
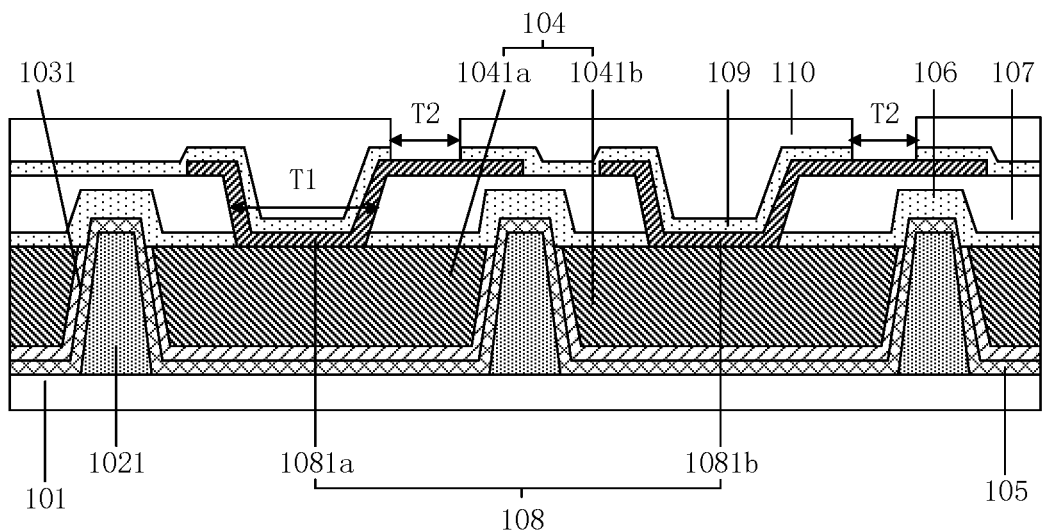
FIG. 5 is a schematic cross-sectional view of an AM type substrate according to an embodiment of the present application.

Optionally, as shown in FIG. 5, the substrate provided in this embodiment further includes:
a first insulating layer 106 located at one side of the second metal layer 104 away from the base substrate 101;
a first planarization layer 107 located at one side of the first insulating layer 106 away from the base substrate 101;
a third metal layer 108 located at one side of the first planarization layer 107 away from the base substrate 101; where the third metal layer 108 includes a plurality of third metal patterns 1081, and the third metal pattern 1081 is electrically coupled to the second metal pattern 1041;
a second insulating layer 109 located at one side of the third metal layer 108 away from the base substrate 101; and
a second planarization layer 110 located at one side of the second insulating layer 109 away from the base substrate 101.

It should be noted that, as shown in FIG. 5, materials of the first insulating layer 106 and the second insulating layer 109 include inorganic insulating materials and/or organic insulating materials. The first planarization layer 107 and the second planarization layer 110 may be made of resin material with photosensitive properties such as photoresist.

The substrate provided in this embodiment may be used as a substrate of a passive matrix (PM) min-led/micro-led display device, and may also be used as a direct-type backlight.

Specifically, as shown in FIG. 5, in the substrate provided in this embodiment, the second metal pattern 1041 includes a first signal line 1041a and a second signal line 1041b; and the third metal pattern 1081 includes a first electrode 1081a and a second electrode 1081b. The first electrode 1081a is electrically coupled to one first signal line 1041a, and the second electrode 1081b is electrically coupled to one second signal line 1041b. The first signal line 1041a and the second signal line 1041b are used to transmit a positive voltage and a negative voltage, respectively, thereby providing LEDs mounted on the substrate with the positive and negative voltages for emitting light.

Figure 6:
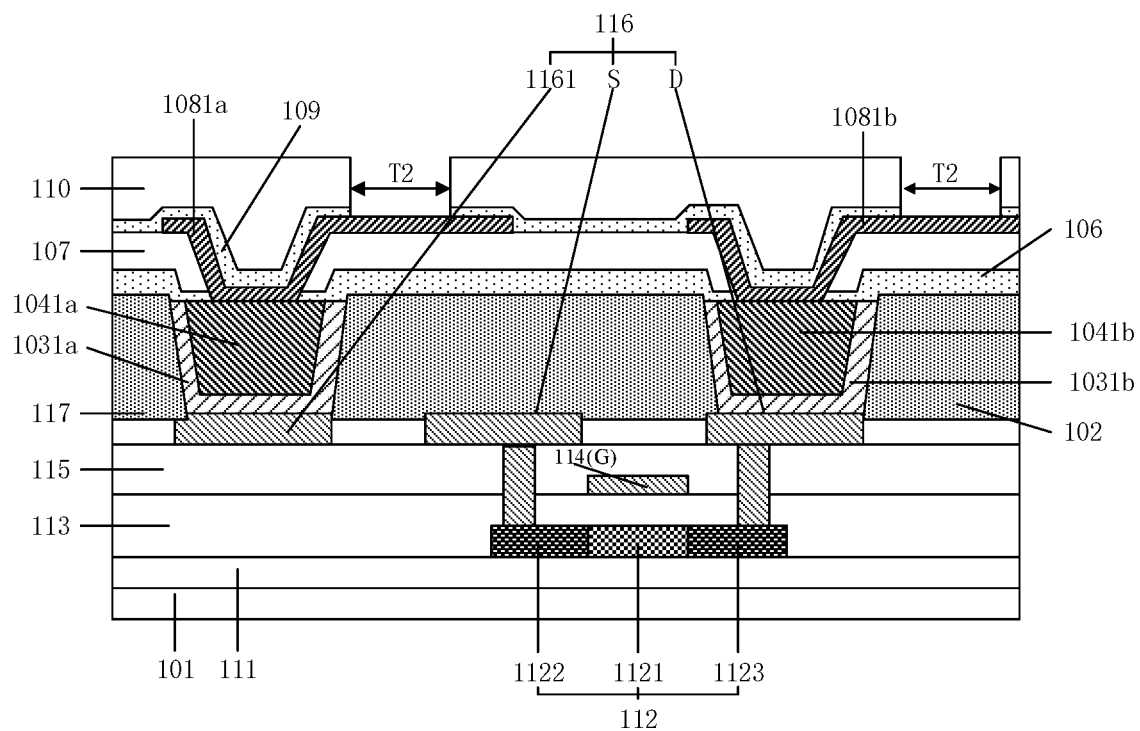
FIG. 6 is a schematic cross-sectional view of a PM type substrate according to an embodiment of the present application.

Optionally, as shown in FIG. 6, the substrate provided in this embodiment further includes:
a buffer layer located between the base substrate 101 and the organic layer 102;
an active layer located between the buffer layer and the organic layer 102; where the active layer includes a plurality of active islands 112, specifically, the active island 112 includes a channel region 1121, a source region 1122 and a drain region 1123;
a third insulating layer 113 located between the active layer and the organic layer 102;
a fourth metal layer 114 located between the third insulating layer 113 and the organic layer 102; where the fourth metal layer 114 includes a plurality of gates G, specifically, the fourth metal layer 114 further includes gate lines, and each gate line is electrically coupled to corresponding gates G;
a fourth insulating layer 115 located between the fourth metal layer 114 and the organic layer 102;
a fifth metal layer 116 located between the fourth insulating layer 115 and the organic layer 102; where the fifth metal layer 116 includes a source electrode S, a drain electrode D, and a power supply line 1161; specifically, the fifth metal layer 116 further includes data lines, and each data line is electrically coupled to corresponding source electrodes; in addition, each source electrode S is electrically coupled to the source region 1022 of the corresponding active island 102, and each drain electrode D is electrically coupled to the drain region 1023 of the corresponding active island 102; and
a fifth insulating layer 117 located between the fifth metal layer 116 and the organic layer 102.

It should be noted that although it is not shown in FIG. 6, a planarization layer may further be provided between the fifth metal layer 116 and the fifth insulating layer 117 to facilitate subsequent formation of the organic layer 102.

The substrate provided in this embodiment is suitable for an active matrix (AM) display device. The film layers in the substrate between the base substrate 101 and the organic layer 102 are used to form a driving circuit. In addition to transistors shown in FIG. 6, the driving circuit further includes capacitors and various signal lines. Specifically, according to actual situations, the power supply line may also be arranged on another metal film layer, or another metal layer is provided to form the power supply line, for example, a metal layer is added between the active layer and the buffer layer to form the power supply line.

Specifically, as shown in FIG. 6, in this embodiment, the second metal pattern 1041 includes a first sub-pattern 1041a electrically coupled to the power supply line 1161 and a second sub-pattern 1041b electrically coupled to the drain electrode D. The third metal pattern 1081 includes a first electrode 1081a and a second electrode 1081b. Each first electrode 1081a is electrically coupled to one first sub-pattern 1041a, and each second electrode 1081b is electrically coupled to one second sub-pattern 1041b.

As shown in FIG. 6, in this embodiment, the first sub-pattern 1041a may be a metal wire electrically coupled to the power supply line, and signals transmitted on the metal wire are only signals transmitted on the power supply line 1161. For example, the power supply line 1161 is a VSS signal line, then the first sub-pattern 1041a may be a wire for transmitting a VSS signal. Of course, according to specific design of the driving circuit, the power supply line 1161 may also be used to transmit a VDD signal, then the first sub-pattern 1041a may be a wire for transmitting a VDD signal. The second sub-pattern 1041b may be a metal block electrically coupled to the drain electrode.

Figure 7:
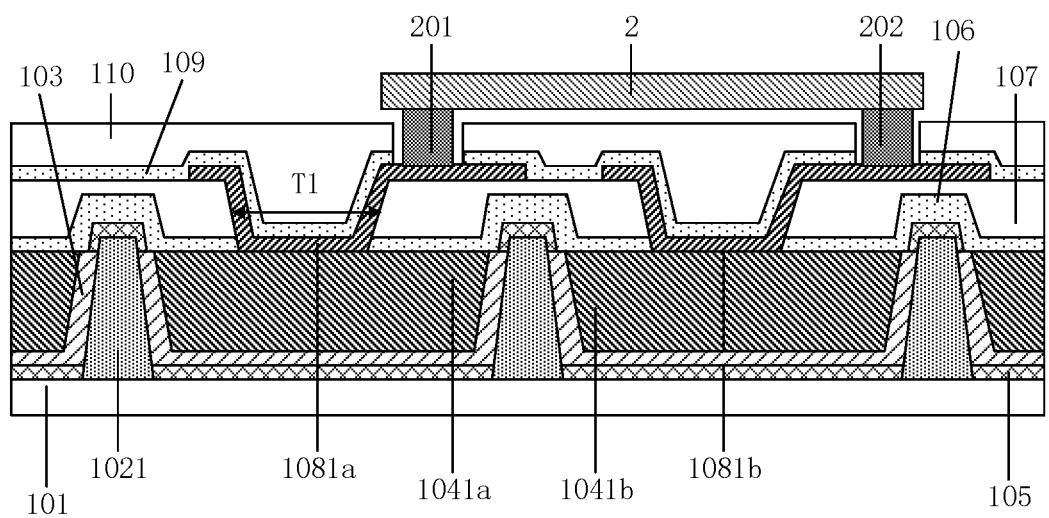
FIG. 7 is a schematic cross-sectional view of a display panel according to an embodiment of the present application.
Figure 8:
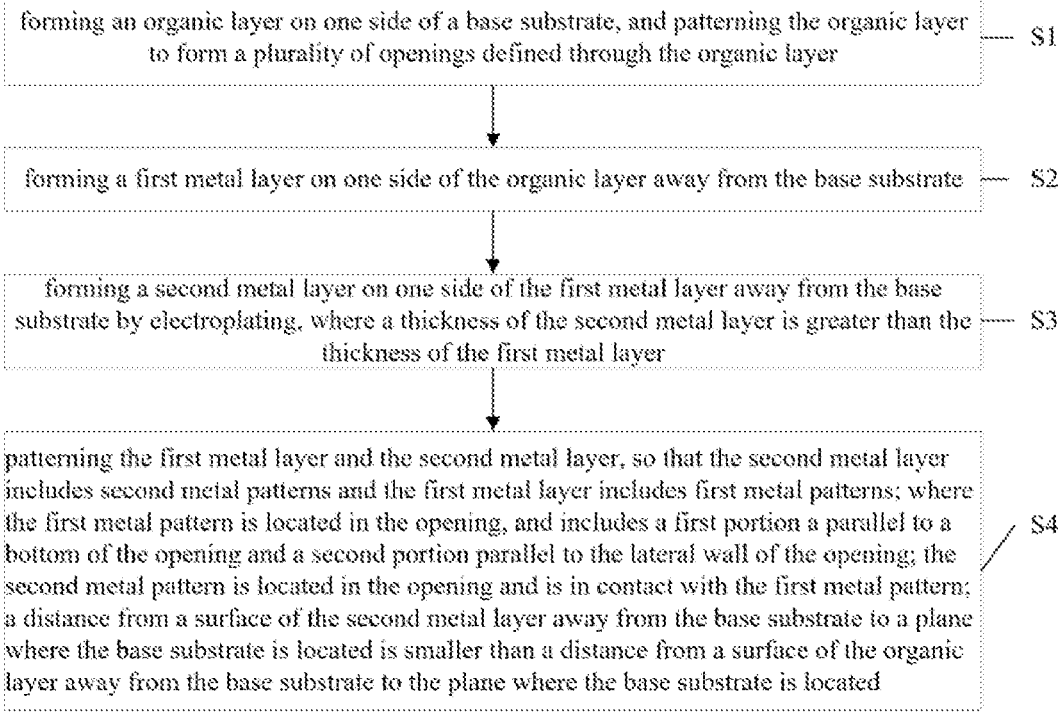
FIG. 8 is a schematic flowchart of a method for manufacturing a substrate according to an embodiment of the present application.

Based on the same inventive concept, the present application provides a display panel. As shown in FIG. 7, the display panel provided in this embodiment includes the substrate in the foregoing embodiment and light-emitting diodes 2 electrically coupled to the substrate in the foregoing embodiment, and has beneficial effects of the substrate in the foregoing embodiments, which will not be repeated here.

Specifically, as shown in FIG. 7, the light-emitting diode 2 is a mini-LED or a micro-LED.

Specifically, as shown in FIG. 7, the light-emitting diode 2 includes a first pin 201 and a second pin 202. The first pin 202 is electrically coupled to the first electrode 1081a on the substrate. The second pin 202 is electrically coupled to the second electrode 1081b on the substrate.

It should be noted that the substrate in the display panel shown in FIG. 7 is a PM-type substrate, and the manner in which an AM-type substrate is electrically coupled to the light-emitting diode 2 is similar to the manner in which the PM-type substrate is electrically coupled to the light-emitting diode 2.

Based on the same inventive concept, the present application provides a method for manufacturing a substrate, as shown in FIG. 1, FIG. 2 and FIG. 8 to FIG. 11, the method includes the following steps.

Step S1: forming an organic layer 102 on one side of a base substrate 101, and patterning the organic layer 102 to form a plurality of openings 1022 defined through the organic layer 102.

Figure 9:
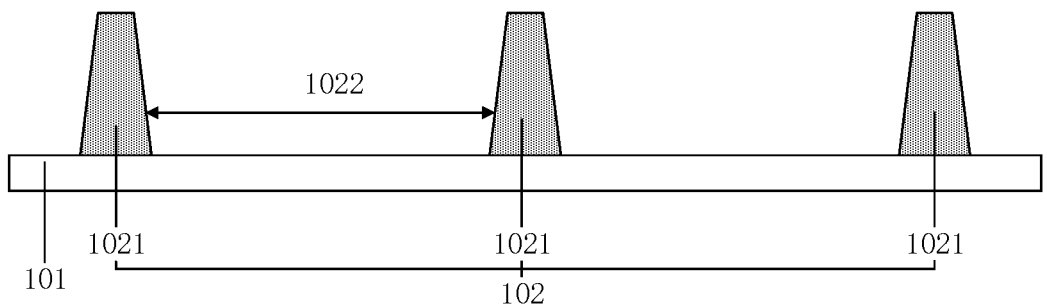
FIG. 9 is a process flowchart of a step S1 of the method shown in FIG. 8.

Specifically, referring to FIG. 9, the base substrate 101 may be a rigid base substrate 101 such as a glass substrate 101. The organic layer 102 is made of photosensitive resin, for example, the organic layer 102 is made of photoresist. In one specific implementation, a thickness of the organic layer 102 is adjusted according to a thickness of the second metal layer 104 to be prepared. The thickness of the organic layer 102 is greater than the thickness of the second metal layer 104. The thickness of the organic layer 102 is in a range of 5 μm to 8 μm.

Step S2: forming a first metal layer 103 on one side of the organic layer 102 away from the base substrate 101.

Specifically, referring to FIG. 10, the first metal layer 103 serves as a seed layer to facilitate subsequent formation of the second metal layer 104 on the first metal layer 103, and a thickness of the first metal layer 103 is 300 Å to 3000 Å. The first metal layer 103 may be a metal copper layer fabricated by magnetron sputtering. According to actual needs, the first metal layer 103 may also be made of an alloy material, such as molybdenum nickel titanium (MoNiTi) alloy. The first metal layer 103 may also be a composite film layer. For example, the first metal layer 103 includes a first layer of molybdenum nickel titanium (MoNiTi) alloy, and a second layer of metal copper material in a direction away from the base substrate 101 on the first layer.

Step S3: forming a second metal layer 104 on one side of the first metal layer 103 away from the base substrate 101 by electroplating, where a thickness of the second metal layer 104 is greater than the thickness of the first metal layer 103.

Specifically, referring to FIG. 11, the second metal pattern 1041 may be a metal wire, a metal electrode, or a combination thereof. The second metal layer 104 is a metal copper layer prepared by an electroplating method. The thickness of the second metal layer 104 is 3 μm to 7 μm.

Step S4: patterning the first metal layer 103 and the second metal layer 104, so that the second metal layer 104 includes a plurality of second metal patterns 1041 and the first metal layer 103 includes a plurality of first metal patterns 1031; where the first metal pattern 1031 is located in the opening 1022, and includes a first portion 1031a parallel to a bottom of the opening 1022 and a second portion 1032b parallel to the lateral wall of the opening 1022; the second metal pattern 1041 is located in the opening 1022 and is in contact with the first metal pattern 1031; a distance from a surface of the second metal layer 104 away from the base substrate 101 to a plane where the base substrate 101 is located is smaller than a distance from a surface of the organic layer 102 away from the base substrate 101 to the plane where the base substrate 101 is located.

In the method for manufacturing the substrate provided in the embodiment of the present application, by first forming the first metal layer 103 on the organic layer 102, the conductivity of the first metal layer 103 can make distribution of electric field densities more uniform, so that the thickness of the second metal layer 104 fabricated by the electroplating method is more uniform, thereby ensuring the conductivity of the substrate. Meanwhile, the uniform thickness of the second metal layer 104 can avoid problems of increased roughness of the second metal layer 104 caused by the etching process.

Optionally, as shown in FIG. 3, the method provided in this embodiment further includes: before forming the first metal layer 103, forming an adhesion enhancement layer 105 on one side of the organic layer 102 away from the base substrate 101, where the adhesion enhancement layer 105 covers a bottom of the opening 1022 and a surface of the organic layer 102.

Specifically, the adhesion enhancement layer 105 is made of SiNx. A thickness of the adhesion enhancement layer 105 is 2000 Å to 6000 Å.

In this embodiment, the adhesion enhancement layer 105 can increase adhesion between the organic layer 102 and the first metal layer 103, thereby improving performance of the substrate. Further, the adhesion enhancement layer 105 can prevent the metal layer from directly contacting the organic layer 102, thereby preventing oxidation of the metal layer caused by the direct contact between the organic layer 102 and the metal layer in the subsequent manufacturing process, and then increasing service life of products.

Figure 13:
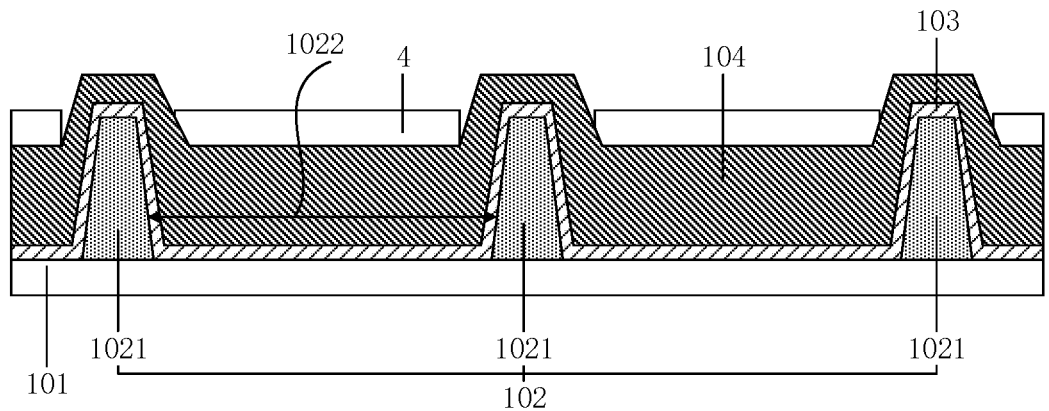
FIG. 13 is a process flowchart of a step S401 of the method shown in FIG. 12.
Figure 14:
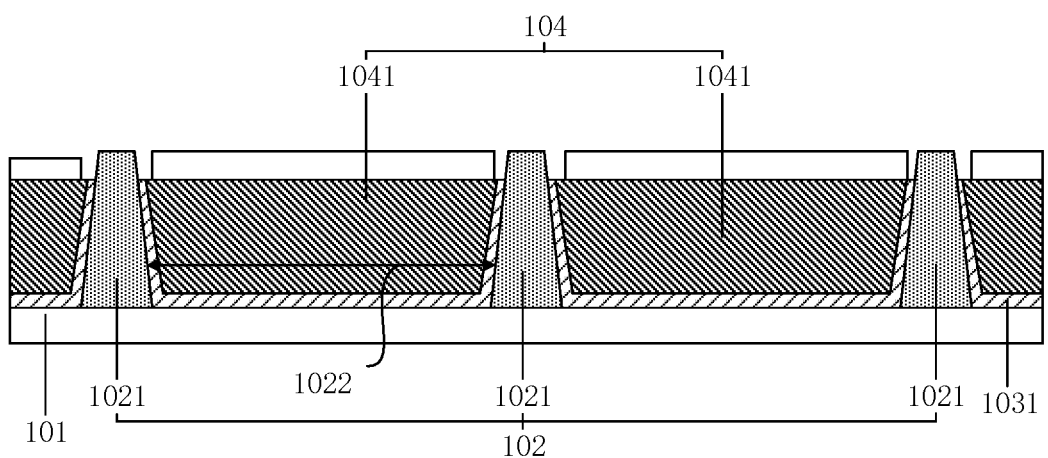
FIG. 14 is a process flowchart of a step S402 of the method shown in FIG. 12.

Optionally, as shown in FIG. 12 to FIG. 14, in the method provided in this embodiment, the step S4 includes the following steps.

Step S401: forming a photoresist layer on one side of the second metal layer 104 away from the base substrate 101, and exposing and developing the photoresist layer to remove the photoresist layer in an area outside the opening 1022.

Specifically, referring to FIG. 13, the remaining photoresist covers the second metal layer 104 in an area of the opening 1022, so as to protect the first metal layer 103 and the second metal layer 104 in the area covered by the remaining photoresist during the subsequent etching process.

Step S402: removing the second metal layer 104 and the first metal layer 103 in the area outside the opening 1022 with wet etching.

Referring to FIG. 14, in the wet etching process, the first metal layer 103 and the second metal layer 104, in the area where the photoresist is removed, i.e., in an area corresponding to the retaining wall, are etched away.

Step S403: peeling off the remaining photoresist to obtain the first metal pattern 1031 and the second metal pattern 1041.

Specifically, the substrate after peeling off the remaining photoresist is as shown in FIG. 1.

In the method of provided in this embodiment, wet etching is used to pattern the second metal layer 104 and the first metal layer 103, which has high selectivity and good uniformity.

It should be noted that the wet etching process needs to be controlled to control a thickness difference between the first region 10 and the second region 20 of the formed second metal pattern 1041 within a reasonable range, which can ensure conductivity requirements of the second metal pattern 1041. For details, the description of this part in the foregoing substrate embodiment may be referred.

Figure 15:
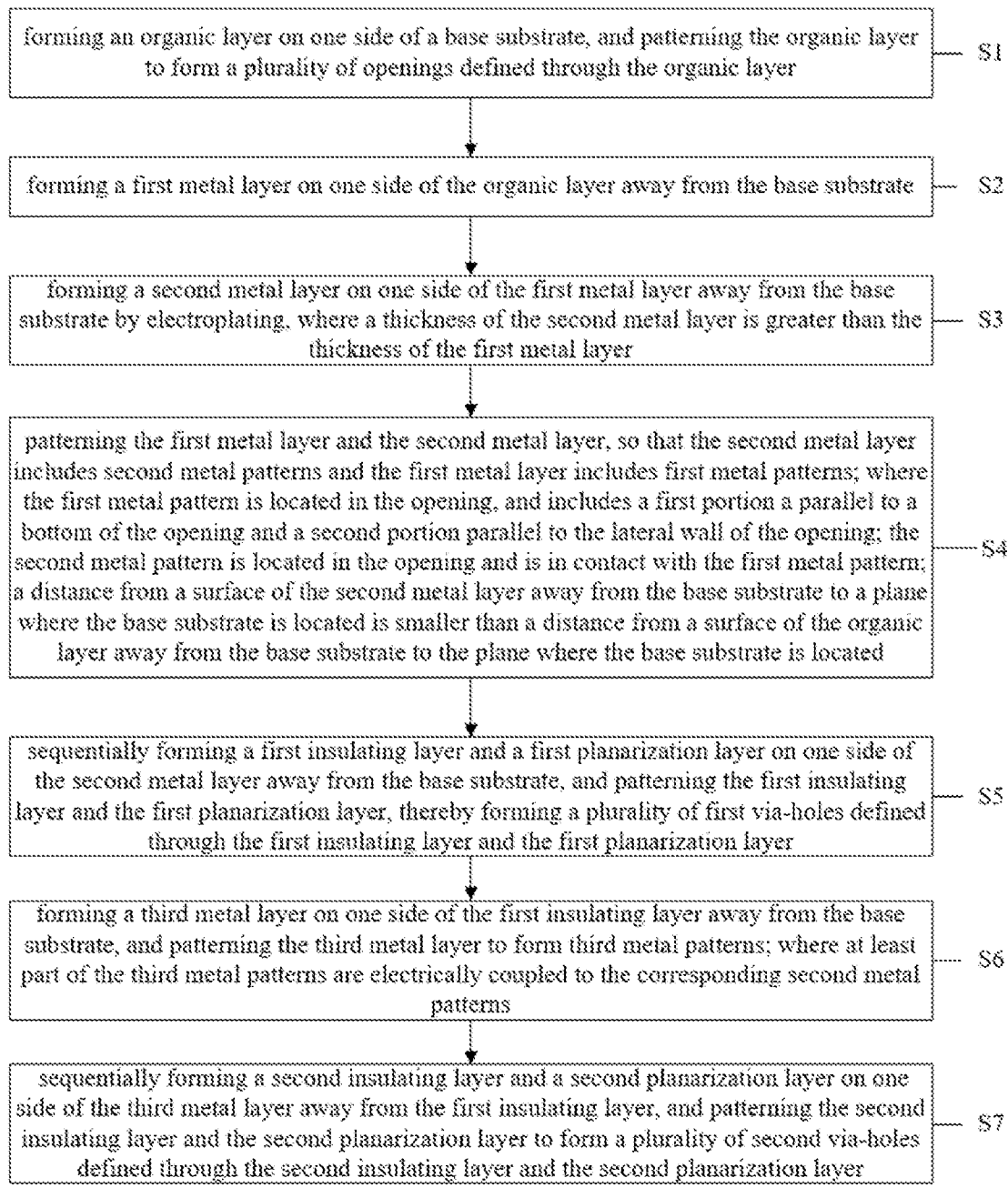
FIG. 15 is a schematic flowchart of another method for manufacturing a substrate according to an embodiment of the present application.

Optionally, as shown in FIG. 15, the method in this embodiment further includes the following steps.

Step S5: sequentially forming a first insulating layer 106 and a first planarization layer 107 on one side of the second metal layer 104 away from the base substrate 101, and patterning the first insulating layer 106 and the first planarization layer 107, thereby forming a plurality of first via-holes T1 defined through the first insulating layer 106 and the first planarization layer 107. Specifically, the first via-hole T1 is used to realize electrical connection between a third metal pattern 1081 and the second metal pattern 1041.

Step S6: forming a third metal layer 108 on one side of the first insulating layer 106 away from the base substrate 101, and patterning the third metal layer 108 to form third metal patterns 1081. At least part of the third metal patterns 1081 are electrically coupled to the corresponding second metal patterns 1041.

Step S7: sequentially forming a second insulating layer 109 and a second planarization layer 110 on one side of the third metal layer 108 away from the first insulating layer 106, and patterning the second insulating layer 109 and the second planarization layer 110 to form a plurality of second via-holes T2 defined through the second insulating layer 109 and the second planarization layer 110. Specifically, the second via-hole T2 is used to realize electrical connection between the third metal pattern 1081 and the LED.

Specifically, the substrate produced by this method is shown in FIG. 5, materials of the first insulating layer 106 and the second insulating layer 109 include inorganic insulating materials and/or organic insulating materials. The first planarization layer 107 and the second planarization layer 110 may be made of resin material with photosensitive properties such as photoresist.

The substrate manufactured by the method provided in this embodiment may be used as a substrate of a passive matrix (PM) min-led/micro-led display device, and may also be used as a direct-type backlight.

The method provided in this embodiment may further include a process of manufacturing a driving circuit. In this case, the manufactured substrate is suitable for an AM display device. The specific process of manufacturing the driving circuit, may refer to the prior art, which will not be repeated here.

By applying the embodiments of the present application, at least the following beneficial effects can be achieved:

In the substrate, the method for manufacturing the same and the display panel provided in the embodiments of the present application, by first forming the first metal layer on the organic layer, the conductivity of the first metal layer can make distribution of electric field densities more uniform, so that the thickness of the second metal layer fabricated by the electroplating method is more uniform, thereby ensuring the conductivity of the substrate. Meanwhile, the uniform thickness of the second metal layer can avoid problems of increased roughness of the second metal layer caused by the etching process.

Those skilled in the art can understand that steps, measures, or solutions in various operations, methods or processes that have been discussed in the present disclosure may be alternated, changed, combined, or deleted. Further, other steps, measures, or solutions in various operations, methods or processes that have been discussed in the present disclosure can be alternated, modified, rearranged, decomposed, combined, or deleted. Further, steps, measures, or solutions in various operations, methods or processes in the conventional technologies can be alternated, modified, rearranged, decomposed, combined, or deleted.

In the descriptions of the present disclosure, it needs to be understood that orientation or positional relationship indicated by the term of "center", "up", "down", "front", "rear", "left", "right", "vertical", "horizontal", "top", "bottom", "inside", or "outer", etc., is based on the drawings, and are only for the convenience of describing the present disclosure and simplifying the description, and not intended to indicate or imply that the device or element as referred to must have a specific orientation or be constructed and operated in a specific orientation, and therefore cannot be understood as a limitation to the present disclosure.

The terms "first" and "second" are used for descriptive purposes only, and cannot be understood as indicating or implying relative importance or implicitly indicating the quantity of technical features as referred to. Therefore, the features defined by "first" and "second" may explicitly or implicitly include one or more of the features. In the descriptions of the present disclosure, unless otherwise stated, "a plurality" means two or more.

In the description of the present disclosure, it should be noted that the term of "installation", "connected", or "connecting" should be understood in a broad sense unless explicitly stated and limited. For example, it may be fixed or removable connection, or may be integral connection; it may be direct connection or indirect connection through an intermediate medium, or, it may be internal communication of two elements. For those of ordinary skill in the art, the specific meanings of the above terms in the present disclosure may be understood on a case-by-case basis.

In the descriptions of this specification, specific features, structures, materials, or characteristics may be combined in a suitable manner in any one or more embodiments or examples.

It should be understood that although the steps in the flowchart of the drawings are sequentially displayed in accordance with the directions of the arrows, these steps are not necessarily performed in the order indicated by the arrows. Unless explicitly stated herein, the execution of these steps is not strictly limited, and they may be performed in other orders. Moreover, at least a part of the steps in the flowchart of the drawings may include multiple sub-steps or multiple stages. These sub-steps or stages are not necessarily performed at the same time, but may be performed at different times; and they are not necessarily performed sequentially, but may be performed in turn or alternately with other steps or at least a part of sub-steps or stages of other steps.

The above descriptions are merely some embodiments of the present disclosure. It should be noted that for those of ordinary skill in the art, without departing from the principles of the present disclosure, various improvements and modifications can be made. These improvements and modifications should fall within the protection scope of the present disclosure.

What is claimed is:

1. A substrate, comprising:
a base substrate;
an organic layer on one side of the base substrate with a plurality of openings defined through the organic layer;
a first metal layer including a plurality of first metal patterns, wherein the first metal pattern is located in the opening, and includes a first portion parallel to a bottom of the opening and a second portion parallel to a lateral wall of the opening;
a second metal layer having a thickness greater than a thickness of the first metal layer; wherein the second metal layer includes a plurality of second metal patterns, the second metal pattern is located in the opening and is in contact with the first metal layer; and, a maximum distance from a surface of the first metal layer away from the base substrate to a plane where the base substrate is located is smaller than a maximum distance from a surface of the organic layer away from the base substrate to the plane where the base substrate is located;
wherein the substrate further includes: an adhesion enhancement layer between the organic layer and the first metal layer;
wherein the adhesion enhancement layer covers the surface of the organic layer and the bottom of the opening.

2. The substrate according to claim 1, wherein the second metal pattern includes a first region having a first thickness, and a second region around the first region and having a second thickness; and the second thickness is not less than 90% of the first thickness.

3. The substrate according to claim 1, wherein the organic layer is made of photosensitive resin; and a thickness of the organic layer is in a range of 5 µm to 8 µm;
the second metal layer is made of material including copper, and a thickness of the second metal layer is in a range of 3 µm to 7 µm.

4. The substrate according to claim 1, wherein the first metal layer and the second metal layer are stacked on the base substrate.

5. A display panel, comprising: a substrate and a light-emitting diode electrically coupled to the substrate;
wherein the substrate includes:
a base substrate;
an organic layer on one side of the base substrate with a plurality of openings defined through the organic layer;
a first metal layer including a plurality of first metal patterns, wherein the first metal pattern is located in the opening, and includes a first portion parallel to a bottom of the opening and a second portion parallel to a lateral wall of the opening;
a second metal layer having a thickness greater than a thickness of the first metal layer; wherein the second metal layer includes a plurality of second metal patterns, the second metal pattern is located in the opening and is in contact with the first metal layer; and, a maximum distance from a surface of the first metal layer away from the base substrate to a plane where the base substrate is located is smaller than a maximum distance from a surface of the organic layer away from the base substrate to the plane where the base substrate is located;
wherein the substrate further includes:
a first insulating layer on one side of the second metal layer away from the base substrate; a first planarization layer on one side of the first insulating layer away from the base substrate; a third metal layer on one side of the first planarization layer away from the base substrate, wherein the third metal layer includes a plurality of third metal patterns, each of the third metal patterns is electrically coupled to one of the second metal patterns; a second insulating layer on one side of the third metal layer away from the base substrate; and a second planarization layer on one side of the second insulating layer away from the base substrate;
or,
an adhesion enhancement layer between the organic layer and the first metal layer, wherein the adhesion enhancement layer covers the surface of the organic layer and the bottom of the opening.

6. The display panel according to claim 5, wherein the second metal pattern includes a first signal line and a second signal line; the third metal pattern includes a first electrode and a second electrode; the first electrode is electrically coupled to one first signal line; and the second electrode is electrically coupled to one second signal line.

7. The display panel according to claim 6, wherein the light-emitting diode includes a first pin and a second pin; the first pin is electrically coupled to the first electrode, and the second pin is electrically coupled to the second electrode.

8. The display panel according to claim 5, wherein the substrate further includes:
a buffer layer between the base substrate and the organic layer;
an active layer between the buffer layer and the organic layer, wherein the active layer includes a plurality of active islands;
a third insulating layer between the active layer and the organic layer;
a fourth metal layer between the third insulating layer and the organic layer, wherein the fourth metal layer includes a plurality of gates;
a fourth insulating layer between the fourth metal layer and the organic layer;
a fifth metal layer between the fourth insulating layer and the organic layer, wherein the fifth metal layer includes a source electrode, a drain electrode and a power supply line;
a fifth insulating layer between the fifth metal layer and the organic layer;

wherein the second metal pattern includes a first sub-pattern electrically coupled to the power supply line and a second sub-pattern electrically coupled to the drain electrode;

the third metal pattern includes a first electrode and a second electrode, the first electrode is electrically coupled to one first sub-pattern, and the second electrode is electrically coupled to one second sub-pattern.

9. The display panel according to claim 8, wherein the light-emitting diode includes a first pin and a second pin; the first pin is electrically coupled to the first electrode, and the second pin is electrically coupled to the second electrode.

10. The display panel according to claim 5, wherein the second metal pattern includes a first region having a first thickness, and a second region around the first region and having a second thickness; and the second thickness is not less than 90% of the first thickness.

11. A method for manufacturing the substrate according to claim 1, including:
   forming an organic layer on one side of a base substrate, and patterning the organic layer to form a plurality of openings defined through the organic layer;
   forming a first metal layer on one side of the organic layer away from the base substrate;
   forming a second metal layer on one side of the first metal layer away from the base substrate by electroplating, wherein a thickness of the second metal layer is greater than a thickness of the first metal layer;
   patterning the first metal layer and the second metal layer, so that the second metal layer includes a plurality of second metal patterns and the first metal layer includes a plurality of first metal patterns; wherein the first metal pattern is located in the opening, and includes a first portion parallel to a bottom of the opening and a second portion parallel to a lateral wall of the opening; the second metal pattern is located in the opening and is in contact with the first metal pattern; a maximum distance from a surface of the second metal layer away from the base substrate to a plane where the base substrate is located is smaller than a maximum distance from a surface of the organic layer away from the base substrate to the plane where the base substrate is located.

12. The method according to claim 11, further including:
   before forming the first metal layer, forming an adhesion enhancement layer on one side of the organic layer away from the base substrate, wherein the adhesion enhancement layer covers the bottom of the opening and the surface of the organic layer.

13. The method according to claim 11, wherein the patterning the first metal layer and the second metal layer, includes:
   forming a photoresist layer on one side of the second metal layer away from the base substrate, and exposing and developing the photoresist layer to remove the photoresist layer in an area outside the opening;
   removing the second metal layer and the first metal layer in the area outside the opening with wet etching; and
   peeling off remaining photoresist to obtain the first metal pattern and the second metal pattern.

14. The method according to claim 13, further including:
   sequentially forming a first insulating layer and a first planarization layer on one side of the second metal layer away from the base substrate, and patterning the first insulating layer and the first planarization layer, thereby forming a plurality of first via-holes defined through the first insulating layer and the first planarization layer;
   forming a third metal layer on one side of the first insulating layer away from the base substrate, and patterning the third metal layer to form third metal patterns; wherein at least part of the third metal patterns are electrically coupled to the corresponding second metal patterns;
   sequentially forming a second insulating layer and a second planarization layer on one side of the third metal layer away from the first insulating layer, and patterning the second insulating layer and the second planarization layer to form a plurality of second via-holes defined through the second insulating layer and the second planarization layer.

15. A substrate, comprising:
   a base substrate;
   an organic layer on one side of the base substrate with a plurality of openings defined through the organic layer;
   a first metal layer including a plurality of first metal patterns, wherein the first metal pattern is located in the opening, and includes a first portion parallel to a bottom of the opening and a second portion parallel to a lateral wall of the opening;
   a second metal layer having a thickness greater than a thickness of the first metal layer; wherein the second metal layer includes a plurality of second metal patterns, the second metal pattern is located in the opening and is in contact with the first metal layer; and, a maximum distance from a surface of the first metal layer away from the base substrate to a plane where the base substrate is located is smaller than a maximum distance from a surface of the organic layer away from the base substrate to the plane where the base substrate is located;
   wherein the substrate further includes:
   a first insulating layer on one side of the second metal layer away from the base substrate;
   a first planarization layer on one side of the first insulating layer away from the base substrate;
   a third metal layer on one side of the first planarization layer away from the base substrate, wherein the third metal layer includes a plurality of third metal patterns, each of the third metal patterns is electrically coupled to one of the second metal patterns;
   a second insulating layer on one side of the third metal layer away from the base substrate; and
   a second planarization layer on one side of the second insulating layer away from the base substrate.

16. The substrate according to claim 15, wherein the second metal pattern includes a first signal line and a second signal line; the third metal pattern includes a first electrode and a second electrode; the first electrode is electrically coupled to one first signal line; and the second electrode is electrically coupled to one second signal line.

17. The substrate according to claim 15, further comprising:
   a buffer layer between the base substrate and the organic layer;
   an active layer between the buffer layer and the organic layer, wherein the active layer includes a plurality of active islands;
   a third insulating layer between the active layer and the organic layer;

a fourth metal layer between the third insulating layer and the organic layer, wherein the fourth metal layer includes a plurality of gates;

a fourth insulating layer between the fourth metal layer and the organic layer;

a fifth metal layer between the fourth insulating layer and the organic layer, wherein the fifth metal layer includes a source electrode, a drain electrode and a power supply line;

a fifth insulating layer between the fifth metal layer and the organic layer;

wherein the second metal pattern includes a first sub-pattern electrically coupled to the power supply line and a second sub-pattern electrically coupled to the drain electrode;

the third metal pattern includes a first electrode and a second electrode, the first electrode is electrically coupled to one first sub-pattern, and the second electrode is electrically coupled to one second sub-pattern.

* * * * *